(12) United States Patent
Liu et al.

(10) Patent No.: US 11,409,314 B2
(45) Date of Patent: Aug. 9, 2022

(54) FULL SWING VOLTAGE CONVERSION CIRCUIT AND OPERATION UNIT, CHIP, HASH BOARD, AND COMPUTING DEVICE USING SAME

(71) Applicant: CANAAN CREATIVE CO., LTD., Beijing (CN)

(72) Inventors: Jieyao Liu, Beijing (CN); Nangeng Zhang, Beijing (CN); Jingjie Wu, Beijing (CN); Shenghou Ma, Beijing (CN)

(73) Assignee: CANAAN CREATIVE CO., LTD., Beijing (CN)

( * ) Notice: Subject to any disclaimer, the term of this patent is extended or adjusted under 35 U.S.C. 154(b) by 0 days.

(21) Appl. No.: 17/095,545

(22) PCT Filed: May 7, 2019

(86) PCT No.: PCT/CN2019/085894
§ 371 (c)(1),
(2) Date: Nov. 11, 2020

(87) PCT Pub. No.: WO2020/057138
PCT Pub. Date: Mar. 26, 2020

(65) Prior Publication Data
US 2021/0405673 A1    Dec. 30, 2021

(30) Foreign Application Priority Data

Sep. 20, 2018 (CN) .......................... 201811104024.6

(51) Int. Cl.
*H03K 19/0185* (2006.01)
*G05F 1/575* (2006.01)
*H03K 19/00* (2006.01)

(52) U.S. Cl.
CPC ......... *G05F 1/575* (2013.01); *H03K 19/0013* (2013.01); *H03K 19/0016* (2013.01); *H03K 19/018528* (2013.01)

(58) Field of Classification Search
None
See application file for complete search history.

(56) References Cited

U.S. PATENT DOCUMENTS 7,639,043 B2 * 12/2009 Koike ................. H03F 3/45237
327/66
7,999,573 B2 * 8/2011 Narwal .......... H03K 19/018528
327/108
(Continued)

FOREIGN PATENT DOCUMENTS

CN        1753309 A     3/2006
CN      104506183 A     4/2015
(Continued)

OTHER PUBLICATIONS

International Search Report and Written Opinion dated Jul. 31, 2019, in related PCT Application No. PCT/CN2019/085894.

*Primary Examiner* — Jeffery S Zweizig
(74) *Attorney, Agent, or Firm* — Maschoff Brennan

(57) ABSTRACT

The invention provides a full swing voltage conversion circuit. The full swing voltage conversion circuit comprises: an input terminal for inputting a first level signal; an output terminal for outputting a second level signal; a differential input unit for inverting the first level signal of the input terminal, and outputting a differential input signal; a conversion unit; and an output driving unit; wherein the full swing voltage conversion circuit further comprises an auxiliary pull-down unit between the input terminal and the conversion unit for receiving a feedback to improve capability of the conversion unit in recognizing the differential input signal, such that the full swing voltage conversion (Continued)

circuit of the invention can convert from inputting a low voltage to outputting a high voltage.

10 Claims, 4 Drawing Sheets

(56) References Cited

U.S. PATENT DOCUMENTS

| | | | |
|---|---|---|---|
| 9,374,090 B2 * | 6/2016 | Zhou | ............ H03K 19/0013 |
| 2006/0226873 A1 | 10/2006 | De Sandre et al. | |
| 2009/0091389 A1 | 4/2009 | Koike | |
| 2016/0118985 A1 | 4/2016 | Zhou et al. | |

FOREIGN PATENT DOCUMENTS

| | | |
|---|---|---|
| CN | 105958994 A | 9/2016 |
| CN | 107528579 A | 12/2017 |
| CN | 107707246 A | 2/2018 |
| CN | 107911110 A | 4/2018 |
| CN | 208985029 U | 6/2019 |
| JP | H0786913 A | 3/1995 |

* cited by examiner

FULL SWING VOLTAGE CONVERSION CIRCUIT AND OPERATION UNIT, CHIP, HASH BOARD, AND COMPUTING DEVICE USING SAME

BACKGROUND OF THE INVENTION

1. Field of the Invention

The invention relates to a level-shifter (LVL), and particularly to a full swing voltage conversion circuit applied in a computing device, and an operation unit, a chip, a hash board, and a computing device using the same.

2. Related Art

Multi-supply voltage domain power technique is applied to a system-on-chip (SoC) and a multiprocessor computing structure more extensively. In the chip applied with the multi-supply voltage domain technique, the chip often includes a plurality of separate voltage domains or voltage islands, and modules in each voltage domain work in a proper power supply voltage according to requirement for timing. Generally, as for the module where timing is critical, the module often works in a high power supply voltage (VDDH) to meet requirement of the chip for speed performance. As for non-critical circuit module, the module works in a low power supply voltage (VDDL), even a subthreshold power supply voltage, thereby reducing power consumption and energy consumption of the chip.

The level-shifter is an indispensable circuit in the multi-supply voltage system, and provides different power supplies for various different voltage domains to ensure transmission of signals among the respective voltage domains. In normal circumstance, the signals are converted from a high voltage domain to a low voltage domain, which is implementable by a common buffer. However, if the signals are converted from a low voltage domain to a high voltage domain, particularly, from a subthreshold voltage domain to a high voltage domain, a more complex circuit is needed.

CN104506183A discloses a level-shifter, as shown in FIG. 1, consisting of a pair of cross-coupled PMOS transistors, a pair of pull-down NMOS transistors and a low voltage inverter supplying differential input. When an input IN is jumped from "0" to VDDL, the transistor M1 pulls down a voltage of the node OUTB to "0", and an output OUT is pre-charged to a high level VDDH through the cross-coupled PMOS transistors. Since a pull-down current supplied by the NMOS transistor working in a low voltage region is less than several orders of magnitude of a pull-up current supplied by the PMOS transistor working in a high voltage region, competition between a pull-up network and a pull-down network is extremely intense, such that the traditional level-shifter cannot convert low threshold signals, and has the problems of large power leakage, a narrow range of input voltage and long delay of conversion from a low voltage to a high voltage.

CN107707246A discloses a subthreshold level-shifter, as shown in FIG. 2, comprising a first normal threshold voltage PMOS transistor MP1, a second normal threshold voltage PMOS transistor MP2 and a first high threshold voltage PMOS transistor MP3, wherein source electrodes of the first normal threshold voltage PMOS transistor MP1 and the second normal threshold voltage PMOS transistor MP2 are connected to a high power voltage, respectively, and a drain electrode of the first normal threshold voltage PMOS transistor MP1 is connected to a source electrode of the first high threshold voltage PMOS transistor MP3, and further comprising: a first low threshold voltage NMOS transistor MN1 and a second low threshold voltage NMOS transistor MN2, wherein a source electrode of the first low threshold voltage NMOS transistor MN1 is grounded, a drain electrode of the second normal threshold voltage PMOS transistor MP2 is connected to a drain electrode of the second low threshold voltage NMOS transistor MN2, a source electrode of the second low threshold voltage NMOS transistor MN2 is grounded, gate electrodes of the first normal threshold voltage PMOS transistor MP1 and the second normal threshold voltage PMOS transistor MP2 are connected to the drain electrode of the first normal threshold voltage PMOS transistor MP1, and a gate electrode of the first high threshold voltage PMOS transistor MP3 is connected to the drain electrode of the second normal threshold voltage PMOS transistor MP2. Meanwhile, a gate electrode of the first low threshold voltage NMOS transistor MN1 serves as one end of a first input terminal of the current mirror connected to an input buffer, and a gate electrode of the second low threshold voltage NMOS transistor MN2 serves as another end of a second input terminal of the current mirror connected to the input buffer. The drain electrode of the first normal threshold voltage PMOS transistor MP1 serves as a first output terminal of the current mirror, and the drain electrode of the second normal threshold voltage PMOS transistor MP2 serves as a second output terminal of the current mirror. A CMOS level conversion circuit of the level-shifter provided in this embodiment is implemented in FIG. 2. Meanwhile, preferably, propagation delay and energy consumption reduction can be optimized using a multiple threshold device (MTCMOS) technique, and design of the CMOS level conversion circuit is further optimized using cooperation of the multiple threshold device. Although such subthreshold level-shifter can convert voltage within a range of low input voltage, various threshold transistors are used in circuit design and production process, so design and production are quite difficult.

SUMMARY OF THE INVENTION

To solve the above problems, the invention provides a full swing voltage conversion circuit, which converts from inputting a low voltage to outputting a high voltage.

To realize the object, the invention provides a full swing voltage conversion circuit, comprising:

an input terminal for inputting a first level signal;

an output terminal for outputting a second level signal;

a differential input unit for inverting the first level signal of the input terminal, and outputting a differential input signal;

a conversion unit for converting a first level of the differential input signal into the second level signal; and an output driving unit for outputting the second level signal to the output terminal;

wherein the full swing voltage conversion circuit further comprises an auxiliary pull-down unit between the input terminal and the conversion unit for receiving a feedback signal from the output driving unit.

In the full swing voltage conversion circuit, capability of the conversion unit in recognizing the differential input unit is improved by turning on the auxiliary pull-down unit to form auxiliary pull-down paths of the conversion unit.

In the full swing voltage conversion circuit, the auxiliary pull-down unit comprises two or more transistors sequentially connected in series.

In the full swing voltage conversion circuit, the auxiliary pull-down unit comprises a first NMOS transistor and a second NMOS transistor connected in series.

In the full swing voltage conversion circuit, a gate electrode of the first NMOS transistor is connected to an input signal, and a gate electrode of the second NMOS transistor is connected to the output driving unit.

In the full swing voltage conversion circuit, the output driving unit comprises a first inverter and a second inverter connected in series, and an output terminal of the first inverter outputs the feedback signal.

To realize the object, the invention further provides a data operation unit, comprising a control circuit, an operational circuit, a memory circuit and a plurality of full swing voltage conversion circuits interconnected with each other, wherein the plurality of full swing voltage conversion circuits are any one of the full swing voltage conversion circuits.

To realize the object, the invention further provides a chip, comprising any one of the data operation units.

To realize the object, the invention further provides a hash board for a computing device, comprising any one of the chips.

To realize the object, the invention further provides a computing device, comprising a power supply board, a control board, a connection board, a radiator and a plurality of hash boards, the control board connected to the hash boards through the connection board, the radiator provided around the hash boards, and the power supply board configured to supply a power supply for the connection board, the control board, the radiator and the hash boards, wherein the hash board is any one of the hash boards.

Hereinafter the invention is described in details with reference to the accompanying drawings and the detailed embodiments, but the invention is not limited thereto.

PREFERABLE EMBODIMENTS OF THE INVENTION

Hereinafter structure principle and working principle of the invention are described in detail with reference to the accompanying drawings.

Specific terms are used in the specification and the subsequent claims to refer to specific components. Those skilled in the art shall understand that the manufacturer may give a different name to the same component. The specification and the subsequent claims distinguish components from each other by different functions of the components, instead of different names. In the whole specification, the same reference sign represents the same element.

"Comprise" and "include" mentioned in the whole specification and the subsequent claims are open words, and shall be explained as "include but is not limited to". In addition, "connection" herein includes any direct or indirect electrical connection means. Indirect electrical connection means comprises connection through other devices.

Figure 1:
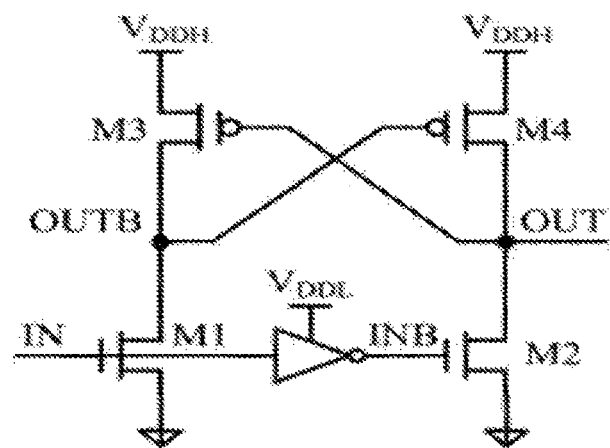
FIG. 1 is a schematic diagram of a level-shifter in the prior art.
Figure 2:
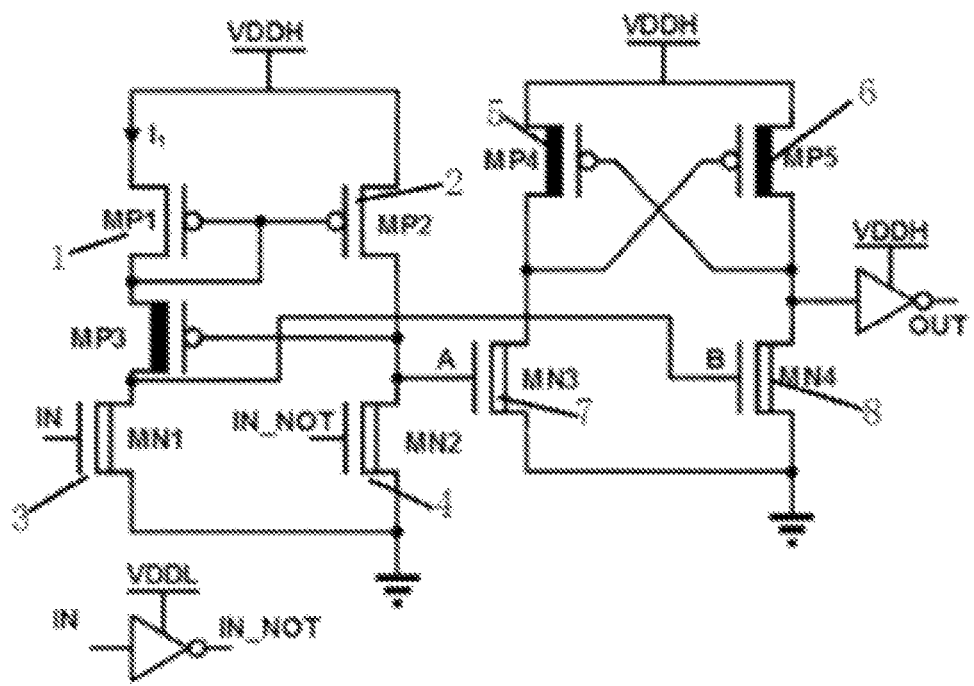
FIG. 2 is a schematic diagram of a subthreshold level-shifter in the prior art.
Figure 3:
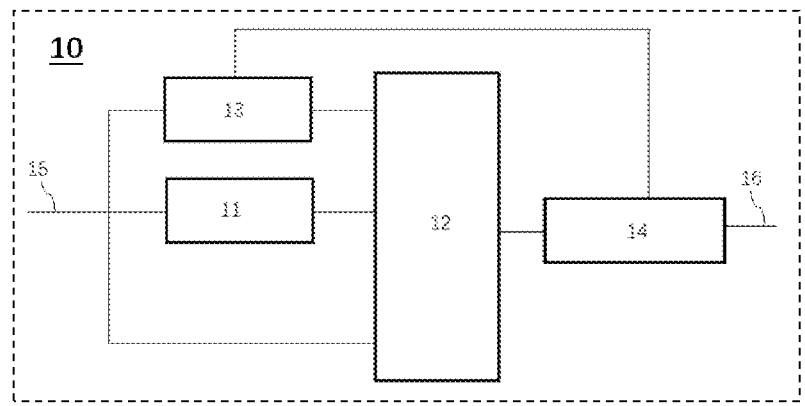
FIG. 3 is a schematic diagram of a full swing voltage conversion circuit according to the invention.

FIG. 3 is a schematic diagram of a full swing voltage conversion circuit according to the invention. As shown in FIG. 3, the full swing voltage conversion circuit 10 comprises a differential input unit 11, a conversion unit 12, an auxiliary pull-down unit 13, an output driving unit 14, an input terminal 15 and an output terminal 16. The input terminal 15 is directly connected to the conversion unit 12 through the differential input unit 11 or the auxiliary pull-down unit 13, the conversion unit 12 is connected to the output driving unit 14, the auxiliary pull-down unit 13 receives a feedback signal from the output driving unit 14, and the output driving unit 14 is connected to the output terminal 16.

Embodiment One

Figure 4:
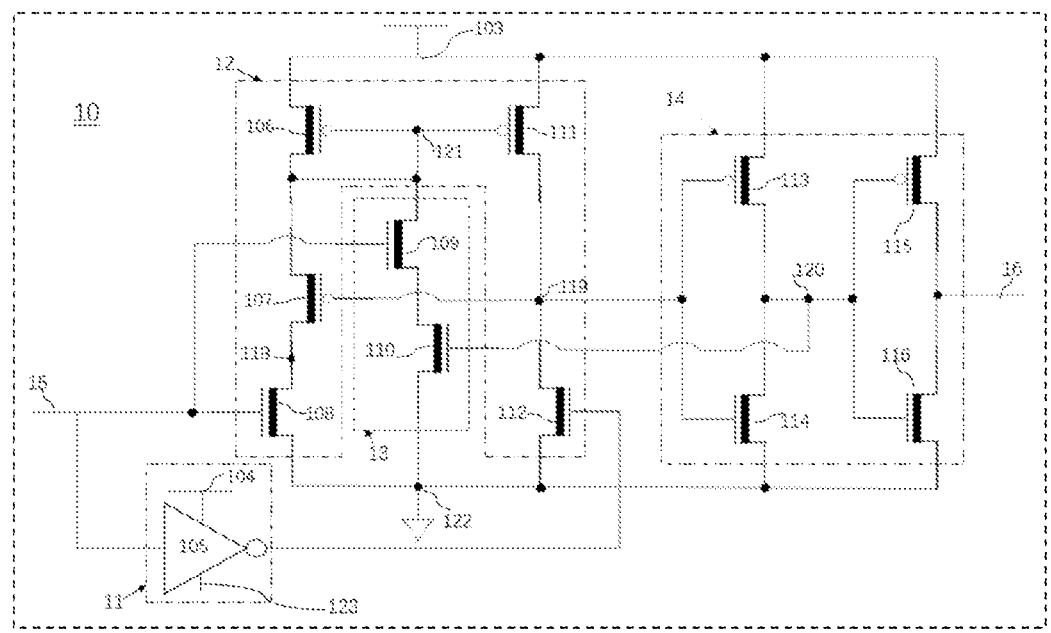
FIG. 4 is a circuit diagram of a full swing voltage conversion circuit according to the invention.

FIG. 4 is a circuit diagram of a full swing voltage conversion circuit according to the invention. In embodiment one, referring to FIGS. 3 and 4, the full swing voltage conversion circuit 10 comprises the input terminal 15, the output terminal 16, a high voltage power supply terminal 103, a low voltage power supply terminal 104, a high voltage ground terminal 122 and a low voltage ground terminal 123. The high voltage power supply terminal 103 is connected to a high voltage power supply VDDH, such as, 0 to 1.8V, in particular, 1.2V, 1.8V, and the like. The low voltage power supply terminal 104 is connected to a low voltage power supply VDDL, such as, 0 to 0.4V, in particular, 0.3V, 0.4V, and the like. The high voltage ground terminal 122 and the low voltage ground terminal 123 are both connected to ground GND.

The differential input unit 11 of the full swing voltage conversion circuit 10 is an inverter 105 working in a low power supply voltage region, a power supply of the inverter 105 is connected to the low voltage power supply terminal 104 to be powered by the low voltage power supply VDDL, and the low voltage ground terminal 123 of the inverter 105 is directed connected to the ground GND. An input terminal of the inverter 105 is connected to the input terminal 15 of the full swing voltage conversion circuit 10 to be inputted with a low level signal VIN, and an output terminal generates a low level signal NVIN in opposite phase with the input terminal 15. The low level signal VIN of the input terminal 15 and the low level signal NVIN outputted inversely via the inverter 105 together form a differential input signal.

The conversion unit 12 of the full swing voltage conversion circuit 10 comprises PMOS transistors 106, 107, 111 and NMOS transistors 108, 112. The PMOS transistors 106 and 111 form a current mirror structure, the PMOS transistor 107 functions for leakage protection, and the NMOS transistors 108 and 112 function as differential input transistors for receiving the differential input signal supplied by the differential input unit 11. Source terminals of the PMOS transistors 106 and 111 are connected to the high voltage power supply terminal 103 to be powered by the high voltage power supply VDDH. A drain electrode of the PMOS transistor 106 is connected to a source electrode of the PMOS transistor 107, and a drain electrode of the PMOS transistor 107 is connected to a drain electrode of the NMOS transistor 108 to form a node 118. A source electrode of the NMOS transistor 108 is connected to the high voltage ground terminal 122. A drain electrode of the PMOS transistor 111 is connected to a drain electrode of the PMOS transistor 112 to form a node 119 as an output terminal of the conversion unit 12 for outputting a high level signal. A source electrode of the NMOS transistor 112 is connected to the high voltage ground terminal 122.

Gate electrodes of the PMOS transistors 106 and 111 are connected together to form a node 121, and connected to the drain electrode of the PMOS transistor 106. A gate electrode of the PMOS transistor 107 is connected to the node 119. A gate electrode of the NMOS transistor 108 is connected to the input terminal 15 of the full swing voltage conversion circuit 10 for receiving the input signal VIN. A gate electrode of the NMOS transistor 112 is connected to an output terminal of the inverter 105 for receiving the signal NVIN in opposite phase with the input signal.

The output driving unit 14 of the full swing voltage conversion circuit 10 is formed by cascaded connection of two-stage inverters consisting of a PMOS transistor 113, a NMOS transistor 114, a PMOS transistor 115 and a NMOS transistor 116, and an input terminal of the output driving unit 14 is connected to the output terminal of the conversion unit 12, i.e., the node 119. A node 120 is formed between the two-stage inverters, and an output terminal of the output driving unit 14 is connected to the output terminal 16 of the full swing voltage conversion circuit 10 as an output of the whole circuit.

The auxiliary pull-down unit 13 of the full swing voltage conversion circuit 10 is formed by NMOS transistors 109 and 111 connected in series. A source electrode of the NMOS transistor 110 is connected to the high voltage ground terminal 122, a drain terminal is connected to a source electrode of the NMOS transistor 109, and a drain electrode of the NMOS transistor 109 is connected to the node 121. A gate electrode of the NMOS transistor 109 is connected to the input terminal 15 of the full swing voltage conversion circuit 10 for receiving the input signal VIN. A gate electrode of the NMOS transistor 110 is connected to the node 120.

Working principle of the full swing voltage conversion circuit 10 in this embodiment is as follows:

Referring to FIG. 4, the input terminal 15 of the full swing voltage conversion circuit 10 is inputted with the signal VIN, and VIN can be "0", which represents a low level, and also can be "1", which represents a high level. The inverter 105 inverts the input signal VIN to generate the signal NVIN. VIN is connected to the gate electrode of the NMOS transistor 108 as one input of the conversion unit 12, and NVIN is connected to the gate electrode of the NMOS transistor 112 as another input of the conversion unit 12. Since VIN and NVIN are inverted signals, when VIN is "0", NVIN is "1", and when VIN is "1", NVIN is "0". Therefore, one of the NMOS transistors 108 and 112 is always in an on state.

It shall be noted that the differential input unit 11 is the inverter 105 working in the low power supply voltage region, and the power supply of the inverter 105 is connected to the low voltage power supply terminal 104. Therefore, when the input terminal 15 is inputted with a high level signal "1", it actually refers to the level VDDL. The conversion unit 12 of the full swing voltage conversion circuit 10 works in a high power supply voltage region to be powered by the high voltage power supply VDDH. In VDDH of the high power supply voltage region, the input VDDL of the low power supply voltage region can only achieve the effect of "half open" or "weak open" of the NMOS transistors 108 and 112 with differential input.

When the input VIN is "0", NVIN is "1", the NMOS transistor 108 is cut off, the node 118 is at a high level, and the state keeps unchanged. The NMOS transistor 112 is turned on, a pull-down path is formed between the node 119 and the ground, and the node 119 is at a low level "0".

Currently, the full swing voltage conversion circuit 10 does not comprise the auxiliary pull-down unit 13. When the input VIN is changed from "0" to "1", NVIN is changed from "1" to "0", the NMOS transistor 108 is changed from cutting off to weak open, the NMOS transistor 112 is cut off, a current path is formed between the NMOS transistor 108 and the ground, and a voltage at the node 118 is pulled down. The previous state at the node 119 is the low level "0", and due to function of circuit delay, the level at the node 119 is still kept to be "0", such that the PMOS transistor 107 is in an open state, and a voltage at the node 121 forms pull-down tendency as the PMOS transistor 107 and the NMOS transistor 108 are turned on.

However, since the gate electrode and the drain electrode of the PMOS transistor 106 are connected together, a diode connection is formed, and the voltage at the node 121 is influenced by pull-up of the PMOS transistor 106. Since pull-down effect is seriously influenced when the NMOS transistor 108 works in a subthreshold on state, and the NMOS transistor 108 may be even pulled up by the PMOS transistor 106 to form clamping, flipping of output cannot be realized.

In addition, when the input VIN is "1", the NMOS transistor 112 is cut off, the level at the node 119 is a high level, and the PMOS transistor 107 is cut off, thereby blocking a direct current path opened simultaneously by the PMOS transistor 106 and the NMOS transistor 108, such that power consumption of the full swing voltage conversion circuit 10 can be reduced.

Since the inverter 105 works in the low voltage power supply VDDL, the high level when VIN is "1" is VDDL. When VDDL is too low, the NMOS transistors 108 and 112 work in a subthreshold state, and it is necessary to improve capability of the conversion unit 12 in distinguishing the differential signals of the two input terminals.

After the auxiliary pull-down unit 13 is introduced, when the input VIN is changed from "0" to "1", NVIN is changed from "1" to "0", and due to function of circuit delay, a level at the node 120 is still kept to be "1", such that the NMOS transistor 110 in the auxiliary pull-down unit 13 is open, the NMOS transistor 109 is weak open simultaneously, and two pull-down paths are generated for the voltage at the node 121, which are two pull-down paths formed by the PMOS transistor 107 and the NMOS transistor 108, as well as the NMOS transistor 109 and the NMOS transistor 110, respectively. When the node 121 is pulled down, the PMOS transistor 111 is turned on, and the NMOS transistor 112 is cut off, such that a voltage at the node 119 is pulled up to VDDH, and finally achieves output jump.

When the level at the node 119 is changed to "1", the PMOS transistor 107 is cut off to close the pull-down path formed by the PMOS transistor 107 and the NMOS transistor 108. Accordingly, the level at the node 120 is changed to "0", the NMOS transistor 110 is cut off to close the pull-down path formed by the NMOS transistor 109 and the NMOS transistor 110, such that the direct current path is turned off to prevent direct current communication.

The NMOS transistors 109 and 110 are low threshold voltage transistors, and the number of the NMOS transistors also can be plural. The plurality of NMOS transistors are connected in series to be turned on simultaneously when the input is changed from "0" to "1".

As can be seen, after the auxiliary pull-down unit 13 is introduced, a pull-down path between the node 121 and the ground is formed by the NMOS transistor 108 and the PMOS transistor 107, and a pull-down path is also formed by the NMOS transistors 109 and 110 in the auxiliary pull-down unit 13. Therefore, the level at the node 119 is rapidly increased to "1", and the level at the node 119 is changed from a ground level to a high voltage power supply level VDDH.

Therefore, when the input terminal 15 is changed from "0" to "1", i.e., from the ground level to a low voltage power supply level VDDL, the output terminal 16 is changed from the ground level to the high voltage power supply level VDDH through the full swing voltage conversion circuit 10 of the invention, thereby converting from a low voltage VDDL to a high voltage VDDH.

When the input VIN is changed from "1" to "0", NVIN is changed from "0" to "1", the level at the node 119 is "1" in a previous state, and the PMOS transistor 107 is closed. The level at the node 120 is "0" in a previous state, and the NMOS transistor 110 is closed. The voltage at the node 121 does not have pull-down paths, and the level is stabilized to a diode connection of the PMOS transistor 106, i.e., a threshold voltage of the PMOS transistor 106 lower than VDDH, i.e., VDDH-Vth. Accordingly, Vds of the PMOS transistor 111 is 0, Vgs is Vth, the PMOS transistor 111 is in an off state, and weak open of the NMOS transistor 112 is sufficient to pull down the voltage at the node 119 to flipping of output of the circuit.

Embodiment Two

FIG. 4 is a circuit diagram of a full swing voltage conversion circuit according to the invention. In embodiment two, referring to FIGS. 3 and 4, the full swing voltage conversion circuit 10 comprises the input terminal 15, the output terminal 16, the high voltage power supply terminal 103, the low voltage power supply terminal 104, the high voltage ground terminal 122 and the low voltage ground terminal 123. Difference from embodiment one is only in that the low voltage power supply terminal 104 is connected to a low voltage power supply VDDL, such as, 0.4 to 0.8V, and 0.8 to 1.2V, in particular, 0.7V, 0.8V, 1.1V, 1.2V, and the low voltage ground terminal 123 is connected to a low voltage ground VSSL, such as, 0 to 0.4V, and 0.4 to 0.8V, in particular, 0.3V, 0.4V, 0.7V, 0.8V. Other circuit structures and connection relations are the same as that in embodiment one, and the details are not described here.

Working principle of the full swing voltage conversion circuit 10 in this embodiment is as follows:

Referring to FIG. 4, the input terminal 15 of the full swing voltage conversion circuit 10 is inputted with the signal VIN, and VIN can be "0", which represents a low level VSSL, and also can be "1", which represents a high level VDDL. The inverter 105 inverts the input signal VIN to generate the signal NVIN.

Similarly with embodiment one, when the input VIN is "0", i.e., VSSL, NVIN is "1", i.e., VDDL, the NMOS transistor 108 is cut off, and the state of the node 118 keeps unchanged. The NMOS transistor 112 is turned on, a pull-down path is formed between the node 119 and ground, and the node 119 is "0".

When the input VIN is changed from "0" to "1", i.e., from VSSL to VDDL, NVIN is changed from "1" to "0", i.e., from VDDL to VSSL, and the level at the node 119 is changed from a ground level GND to a high voltage power supply level VDDH.

Therefore, when the input terminal 15 is changed from the low level VSSL to the high level VDDL, the output terminal 16 is changed from the ground level GND to the high voltage power supply level VDDH through the full swing voltage conversion circuit 200 in this embodiment, thereby converting from a low voltage VSSL-VDDL to a high voltage GND-VDDH.

Figure 5:
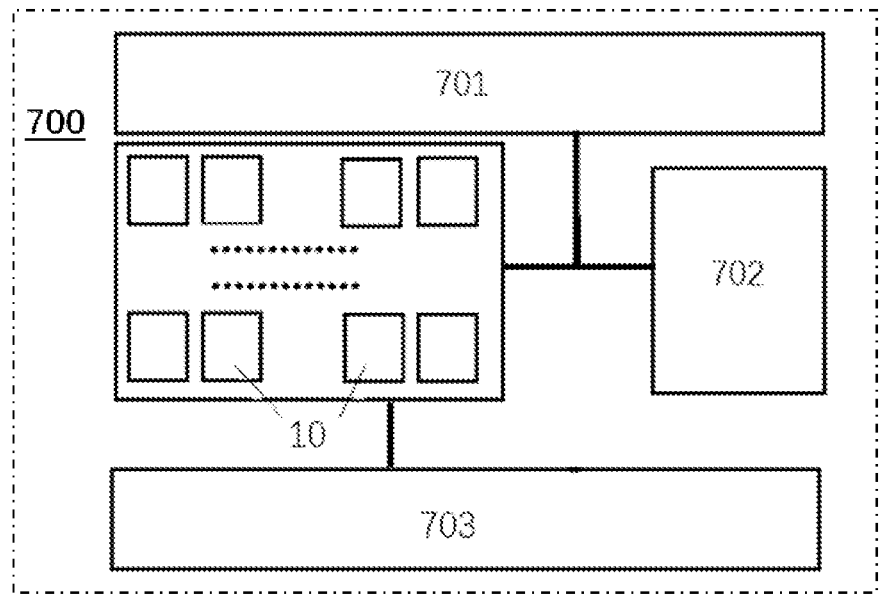
FIG. 5 is a schematic diagram of a data operation unit according to the invention.

The invention further provides a data operation unit, and FIG. 5 is a schematic diagram of a data operation unit according to the invention. As shown in FIG. 5, the data operation unit 700 comprises a control circuit 701, an operational circuit 702, a memory circuit 703 and a plurality of full swing voltage conversion circuits 10. The control circuit 701 makes voltage conversion to data read out from the memory circuit 703 through the full swing voltage conversion circuits 10, the operational circuit 702 performs operation on the read data, and then the control circuit 701 outputs operation results.

Figure 6:
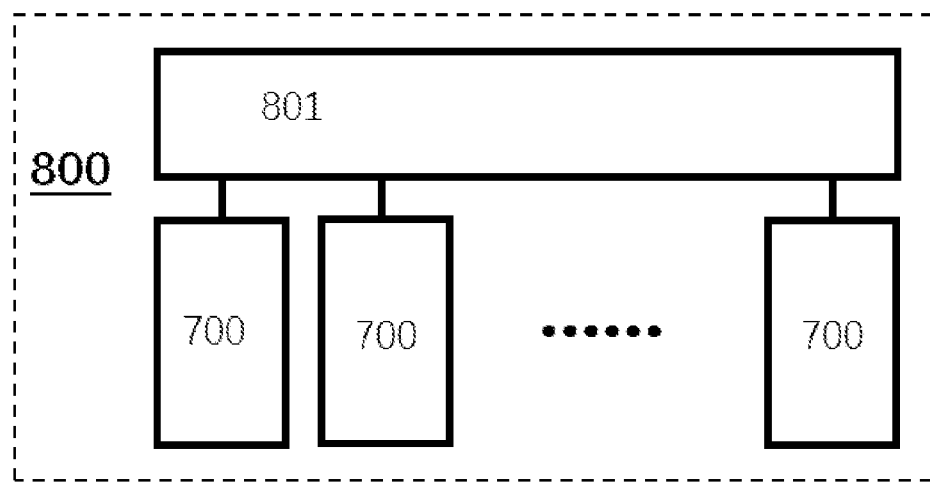
FIG. 6 is a schematic diagram of a chip according to the invention.

The invention further provides a chip, and FIG. 6 is a schematic diagram of a chip according to the invention. As shown in FIG. 6, the chip 800 comprises a control unit 801 and one or more data operation units 700. The control unit 801 inputs data into the data operation units 700, and processes data outputted from the data operation units 700.

Figure 7:
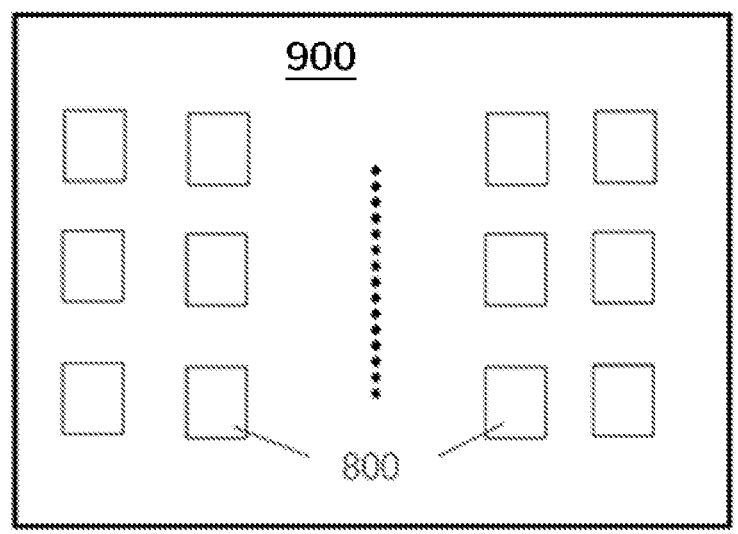
FIG. 7 is a schematic diagram of a hash board according to the invention.

The invention further provides a hash board, and FIG. 7 is a schematic diagram of a hash board according to the invention. As shown in FIG. 7, each of the hash boards 900 comprises one or more chips 800 to perform hash operation on working data sent downstream from a mining pool.

Figure 8:
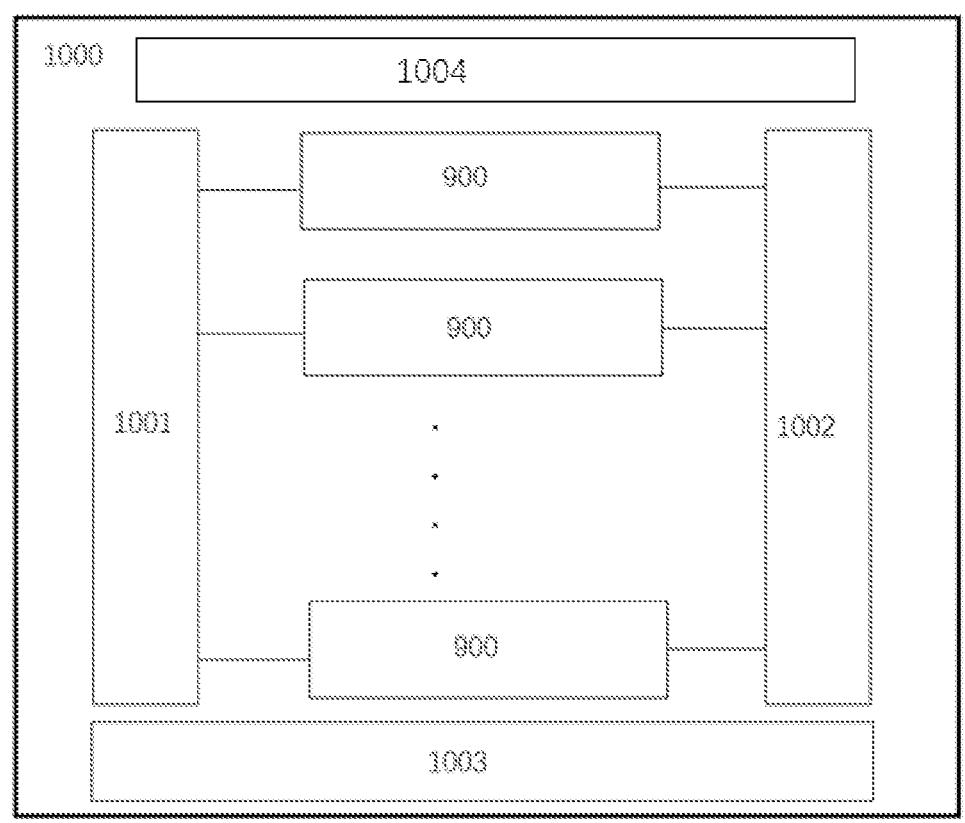
FIG. 8 is a schematic diagram of a computing device according to the invention.

The invention further provides a computing device, and the computing device is preferably configured to operation of mining virtual digital currency. Of course, the computing device also can be configured to any other massive operations, and FIG. 8 is a schematic diagram of a computing device according to the invention. As shown in FIG. 8, each of the computing devices 1000 comprises a connection board 1001, a control board 1002, a radiator 1003, a power supply board 1004, and one or more hash boards 900. The control board 1002 is connected to the hash boards 900 through the connection board 1001, and the radiator 1003 is provided around the hash boards 900. The power supply board 1004 is configured to supply a power supply to the connection board 1001, the control board 1002, the radiator 1003 and the hash boards 900.

It shall be noted that in the invention, orientation or positional relationship indicated by the terms "transverse", "longitudinal", "up", "down", "front", "back", "left", "right", "vertical", "horizontal", "top", "bottom", "in", "out", and the like is the orientation or positional relationship illustrated by the drawings, and is only for the purpose of describing the invention and simplifying the explanation, rather than indicating or suggesting that the referred device or element must have specific orientation, and be constructed and operated in specific orientation, so it shall not be understood as limits to the invention.

Although the embodiments of the invention have been disclosed above, they can be fully applied to various fields suitable for the invention but not as limits to those listed in the specification and the embodiments. For those skilled in the art, additional modifications can be easily implemented, so without departing from general concepts defined by the appended claims and equivalent scopes, the invention is not limited to specific details and figures illustrated and described here.

In other words, the invention also may have various other embodiments, and those skilled in the art shall make various corresponding modifications and variations according to the invention without departing from spirit and essence of the invention, but these corresponding modifications and variations shall belong to the scope protected by the appended claims of the invention.

INDUSTRIAL APPLICABILITY

Application of a full swing voltage conversion circuit and an operation unit, a chip, a hash board, and a computing device using the same of the invention has the following advantageous effects:

can improve capability of the voltage conversion unit in recognizing the differential input signal, such that the full swing voltage conversion circuit of the invention can convert from inputting a low voltage to outputting a high voltage.

What is claimed is:

1. A full swing voltage conversion circuit, comprising:
an input terminal for inputting a first level signal;
an output terminal for outputting a second level signal;
a differential input unit for inverting the first level signal of the input terminal, and outputting a differential input signal;
a conversion unit for converting a first level of the differential input signal into the second level signal; and
an output driving unit for outputting the second level signal to the output terminal;
wherein the full swing voltage conversion circuit further comprises an auxiliary pull-down unit between the input terminal and the conversion unit for receiving a feedback signal from the output driving unit.

2. The full swing voltage conversion circuit according to claim 1, wherein capability of the conversion unit in recognizing the differential input unit is improved by turning on the auxiliary pull-down unit to form auxiliary pull-down paths of the conversion unit.

3. The full swing voltage conversion circuit according to claim 2, wherein the auxiliary pull-down unit comprises two or more transistors sequentially connected in series.

4. The full swing voltage conversion circuit according to claim 3, wherein the auxiliary pull-down unit comprises a first NMOS transistor and a second NMOS transistor connected in series.

5. The full swing voltage conversion circuit according to claim 4, wherein a gate electrode of the first NMOS transistor is connected to the first level signal of the input terminal, and a gate electrode of the second NMOS transistor is connected to the feedback signal of the output driving unit.

6. The full swing voltage conversion circuit according to claim 5, wherein the output driving unit comprises a first inverter and a second inverter connected in series, and an output terminal of the first inverter outputs the feedback signal.

7. A data operation unit, comprising a control circuit, an operational circuit, a memory circuit and a plurality of full swing voltage conversion circuits interconnected with each other, wherein the plurality of full swing voltage conversion circuits are the full swing voltage conversion circuit according to claim 1.

8. A chip, comprising the data operation unit according to claim 7.

9. A hash board for a computing device, comprising the chip according to claim 8.

10. A computing device, comprising a power supply board, a control board, a connection board, a radiator and a plurality of hash boards, the control board connected to the hash boards through the connection board, the radiator provided around the hash boards, and the power supply board configured to supply a power supply for the connection board, the control board, the radiator and the hash boards, wherein the hash board is the hash board according to claim 9.

* * * * *